(12) United States Patent
Chae et al.

(10) Patent No.: US 8,479,083 B2
(45) Date of Patent: Jul. 2, 2013

(54) FLASH MEMORY DEVICES HAVING MULTI-BIT MEMORY CELLS THEREIN WITH IMPROVED READ RELIABILITY

(75) Inventors: Donghyuk Chae, Seoul (KR); Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 12/967,969

(22) Filed: Dec. 14, 2010

(65) Prior Publication Data

US 2011/0197015 A1 Aug. 11, 2011

(30) Foreign Application Priority Data

Feb. 8, 2010 (KR) ........................ 10-2010-0011554

(51) Int. Cl.
*G06F 11/00* (2006.01)
(52) U.S. Cl.
USPC ............................. 714/780; 714/721; 714/773
(58) Field of Classification Search
USPC ................ 714/721, 763, 773, 780; 365/185.2
See application file for complete search history.

(56) References Cited

U.S. PATENT DOCUMENTS

| | | | | |
|---|---|---|---|---|
| 6,816,409 B2 * | 11/2004 | Tanaka | ..................... | 365/185.03 |
| 7,023,735 B2 * | 4/2006 | Ban et al. | ................... | 365/185.2 |
| 7,800,943 B2 * | 9/2010 | Ravasio et al. | ........... | 365/185.03 |
| 7,975,192 B2 | 7/2011 | Sommer et al. | | |
| 2008/0055990 A1 * | 3/2008 | Ishikawa et al. | ......... | 365/185.09 |
| 2008/0151617 A1 * | 6/2008 | Alrod et al. | ................ | 365/185.2 |
| 2008/0209111 A1 * | 8/2008 | Kang | ............................ | 711/103 |
| 2009/0177931 A1 | 7/2009 | Song et al. | | |
| 2009/0235128 A1 | 9/2009 | Eun et al. | | |
| 2010/0223538 A1 * | 9/2010 | Sakurada | ....................... | 714/801 |
| 2011/0231738 A1 * | 9/2011 | Horisaki | ....................... | 714/773 |

FOREIGN PATENT DOCUMENTS

| | | |
|---|---|---|
| JP | 2008-059679 | 9/2008 |
| KR | 1020090075101 A | 7/2009 |
| KR | 1020090097673 A | 9/2009 |

* cited by examiner

*Primary Examiner* — Marc Duncan
(74) *Attorney, Agent, or Firm* — Myers Bigel Sibley & Sajovec, P.A.

(57) ABSTRACT

Integrated circuit memory devices include an array of non-volatile N-bit memory cells, where N is an integer greater than one. Control circuitry is also provided to reliably read data from the N-bit memory cells. This control circuitry, which is electrically coupled to the array, is configured to determine, among other things, a value of at least one bit of data stored in a selected N-bit memory cell in the array. This is done by decoding at least one hard data value and a plurality of soft data values (e.g., 6 data values) read from the selected N-bit memory cell using a corresponding plurality of unequal read voltages applied to the selected N-bit memory cell during a read operation.

16 Claims, 12 Drawing Sheets

FLASH MEMORY DEVICES HAVING MULTI-BIT MEMORY CELLS THEREIN WITH IMPROVED READ RELIABILITY

REFERENCE TO PRIORITY APPLICATION

This application claims priority to Korean Patent Application No. 10-2010-0011554, filed Feb. 8, 2010, the contents of which are hereby incorporated herein by reference.

FIELD

The invention relates to semiconductor memory devices and, more particularly, to flash memory devices and methods of operating same.

BACKGROUND

Semiconductor memory devices are generally classified into volatile memory devices (e.g., DRAMs and SRAMs) and nonvolatile memory devices (e.g., EEPROMs, FRAMs, PRAMs, MRAMs, and flash memories). A volatile memory device loses data stored therein when power supply thereto is interrupted, whereas a nonvolatile memory device retains data stored therein even when power supply thereto is interrupted. In particular, a flash memory device is widely used as a storage medium in a computer system because of its high program speed, low power consumption and large data storage capacity.

In the flash memory device, data states storable in each memory cell may be determined according to the number of bits stored in the memory cell. A memory cell storing 1-bit data per cell is called a single-bit cell or a single-level cell (SLC), and a memory cell storing multi-bit data (i.e., at least 2-bit data) per cell is called a multi-bit cell, a multi-level cell (MLC) or a multi-state cell. The multi-bit cell is advantageous for high integration. However, as the number of bits programmed in each memory cell increase, the reliability decreases and the read failure rate increases.

For example, if k bits are to be programmed in a memory cell, one of $2^k$ threshold voltages must be formed in the memory cell. Due to the minute difference between the electrical characteristics of memory cells, the threshold voltages of memory cells programmed with the same data may form a predetermined range of threshold voltage distribution. Threshold voltage distributions may correspond respectively to $2^k$ data values that may be generated by k bits.

However, a voltage window available for threshold voltage distributions is limited. Therefore, as the value k increases, the distance between the threshold voltage distributions decreases and the adjacent threshold voltage distributions may overlap each other. As the adjacent threshold voltage distributions overlap each other, read data may include a number of error bits (e.g., several error bits or several tens of error bits). What is therefore required is a scheme for efficiently detecting/correcting a read error in data read from a flash memory device that stores multi-bit data.

SUMMARY

The present disclosure provides a flash memory device and a read method thereof, which can efficiently provide additional information for error correction without an increase in the chip size.

Integrated circuit memory devices according to embodiments of the invention include an array of nonvolatile N-bit memory cells, where N is an integer greater than one. Control circuitry is also provided to reliably read data from the N-bit memory cells. This control circuitry, which is electrically coupled to the array, is configured to determine, among other things, a value of at least one bit of data stored in a selected N-bit memory cell in the array. This is done by decoding at least one hard data value and a plurality of soft data values (e.g., 6 data values) read from the selected N-bit memory cell using a corresponding plurality of unequal read voltages applied to the selected N-bit memory cell during a read operation.

According to some embodiments of the invention, the control circuitry represents determining means. This control circuitry includes circuitry for reading the hard data value from the selected N-bit memory cell by applying a read reference voltage to the selected N-bit memory cell. The control circuitry also includes circuitry for reading the plurality of soft data values from the selected N-bit memory cell by applying a plurality of read voltages, which are less than or greater than the read reference voltage, to the selected N-bit memory cell.

According to additional embodiments of the invention, the control circuitry includes circuitry for reading a first plurality of soft data values from the selected N-bit memory cell by applying a first plurality of read voltages that are less than the read reference voltage to the selected N-bit memory cell. This circuitry is also configured to read a second plurality of soft data values from the selected N-bit memory cell by applying a second plurality of read voltages that are greater than the read reference voltage to the selected N-bit memory cell.

In particular, the control circuitry may include a row select circuit electrically coupled to a plurality of word lines in the array, and a voltage generator configured to supply the row select circuit with read voltages (e.g., the read reference voltage and the first and second plurality of read voltages). The control circuitry may also include a page buffer circuit electrically coupled to a plurality of bit lines in the array and control logic. This control logic is electrically coupled to the voltage generator, the row select circuit and the page buffer circuit. The control circuitry may also include an error checking and correction (ECC) circuit configured to receive the at least one hard data value and a plurality of soft data values read from the selected N-bit memory cell during the read operation.

According to still further embodiments of the invention, the page buffer circuit may be configured to encode the plurality of soft data values into a multi-bit reliability data value that specifies a relative degree of accuracy of a corresponding hard data value. The control circuitry may also include an error checking and correction (ECC) circuit configured to receive the at least one hard data value and the multi-bit reliability data value. For example, if the N-bit memory cells are 3-bit memory cells, then the page buffer circuit may be configured to encode the plurality of soft data values into a 2-bit reliability data value that specifies a relative degree of accuracy of a corresponding hard data value.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
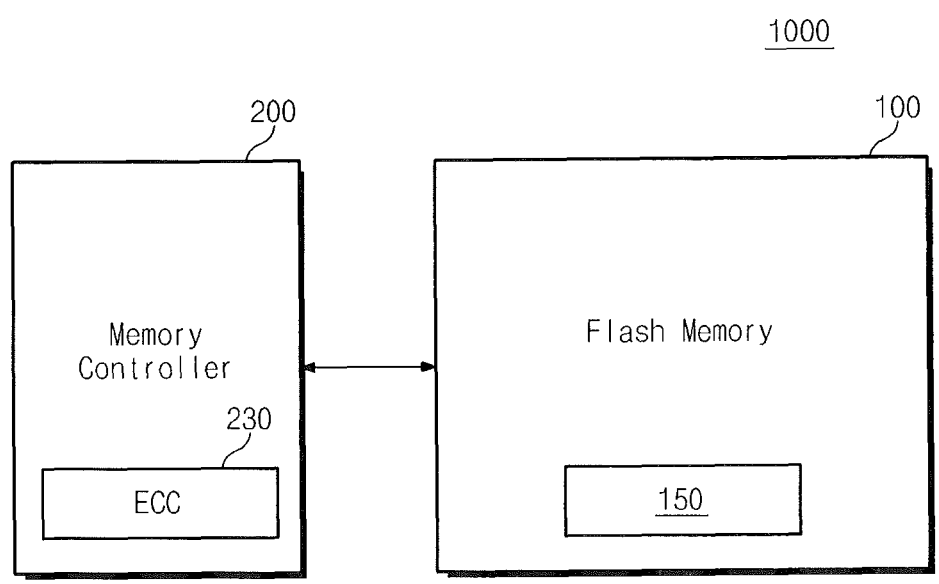
FIG. 1 is a diagram illustrating a schematic structure of a memory system including a flash memory according to an exemplary embodiment of the inventive concept.

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout. The circuit configurations and the read operations of a flash memory device according to the inventive concept, which will be described below, are merely exemplary and various changes in form and details may be made therein without departing from the spirit and scope of the inventive concept.

FIG. 1 is a diagram illustrating a schematic structure of a memory system 1000 including a flash memory 100 according to an exemplary embodiment of the inventive concept.

Referring to FIG. 1, the memory system 1000 may include a flash memory 100 and a memory controller 200. The memory controller 200 may be configured to control the flash memory 100. The memory controller 200 may include an error correction circuit (ECC) 230 for correcting an error in data read from the flash memory 100. The ECC 230 may use a hard decision scheme or a soft decision scheme as an error correction scheme.

The hard decision scheme corrects an error in data by using only an error correction code and data (hereinafter referred to as hard decision data) that are read according to the on/off characteristics of a memory cell when a predetermined reference voltage is applied thereto. The soft decision scheme corrects an error in data by using not only the error correction code and the hard decision data but also additional information (hereinafter referred to as soft decision data) about the reliability of the hard decision data. As an example, the inventive concept illustrates the case where the ECC 230 uses a soft decision scheme to perform more accurate error correction. The encoding/decoding scheme of an error correction code applicable to the ECC 230 is not limited to a specific embodiment but may vary according to various embodiments.

The flash memory 100 may provide hard decision data and a plurality of soft decision data to the ECC 230 for each reference voltage (e.g., Ref1 or Ref2) in a read operation. The hard decision data and the soft decision data may be read through a page buffer from the memory cells of the flash memory 100. A read operation of the page buffer on the hard decision data and the soft decision data may be performed under the control of a control logic circuit 150 in the flash memory 100. The hard decision data may be read by applying the reference voltage. The soft decision data may be read by applying a plurality of variable read voltages that vary from the reference voltage. The soft decision data read from the flash memory 100 may be provided to the ECC 230 without a change in the read data bits. Also, the soft decision data may be encoded into a predetermined data format (hereinafter referred to as reliability data) before being provided to the ECC 230.

As will be described below, the flash memory 100 of the inventive concept is configured to generate reliability data for error correction by the page buffer without using an additional circuit (e.g., an encoder) that encodes the soft decision data by a predetermined code. That is, the soft decision data, or the reliability data corresponding to the soft decision data may be outputted by the page buffer. Thus, the inventive concept makes it possible to increase the error correction efficiency in a read operation of the flash memory without an increase in the chip size and to improve the reliability of the read multi-bit data.

Figure 2:
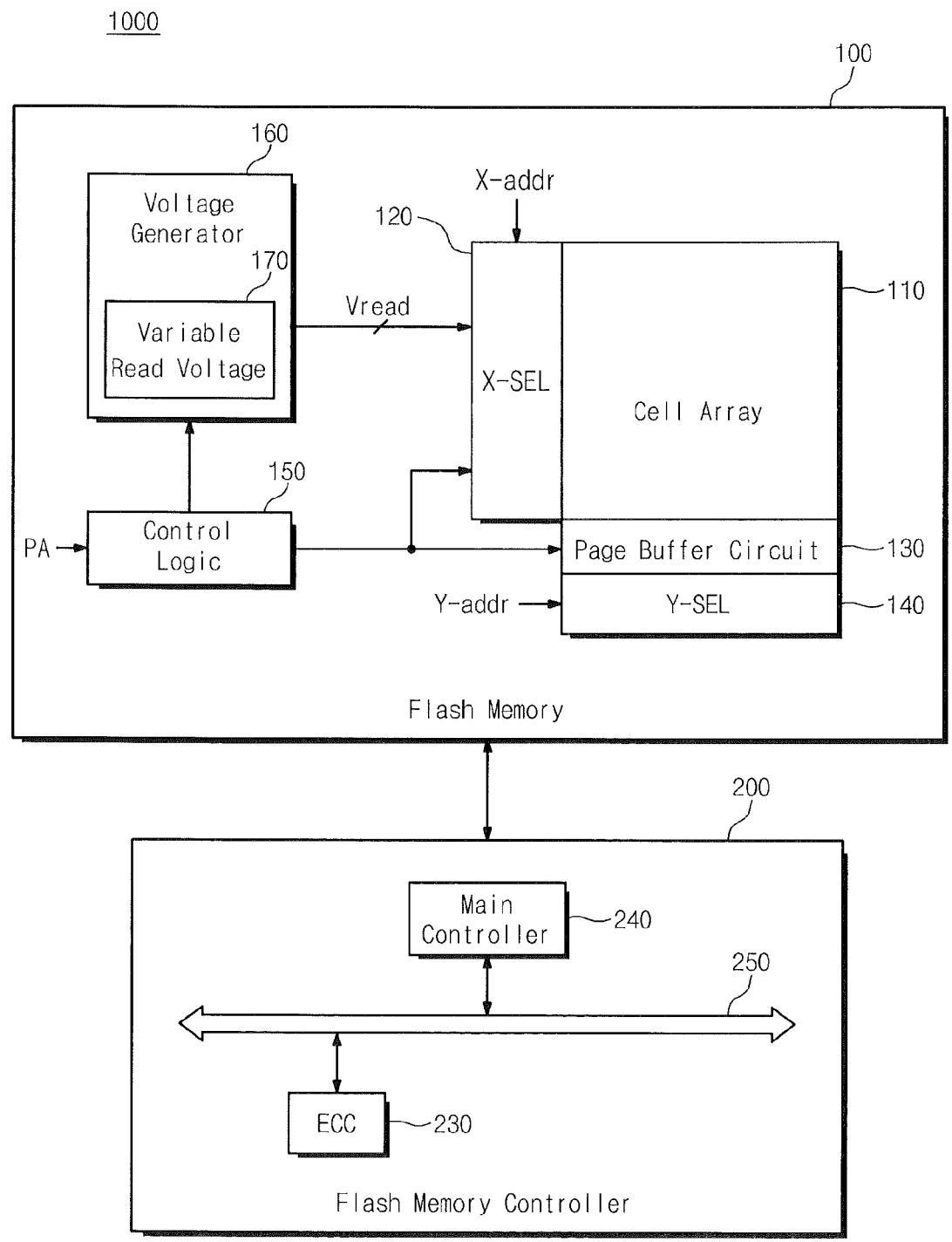
FIG. 2 is a diagram illustrating a detailed structure of the memory system of FIG. 1 according to an exemplary embodiment of the inventive concept.
Figure 3:
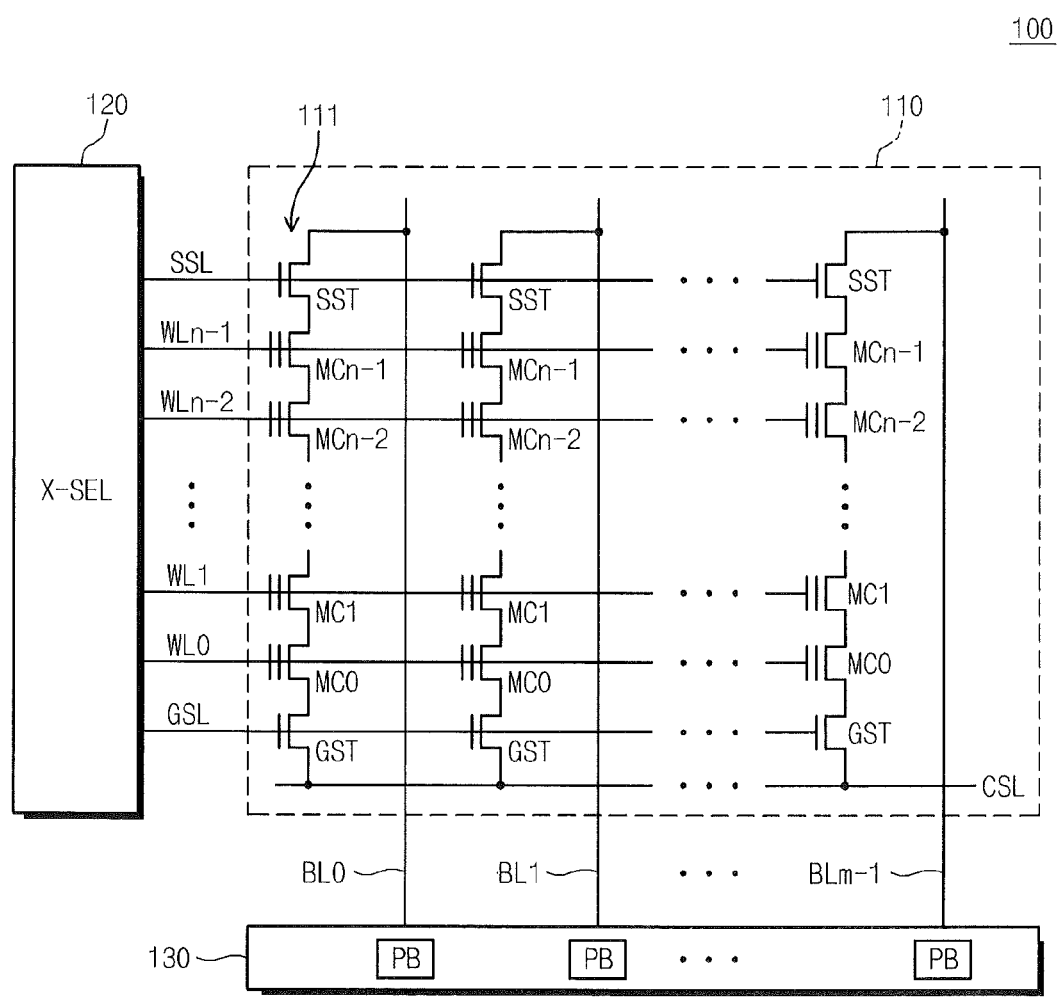
FIG. 3 is a diagram illustrating a detailed structure of the flash memory of FIGS. 1 and 2 according to an exemplary embodiment of the inventive concept.

FIG. 2 is a diagram illustrating a detailed structure of the memory system 1000 of FIG. 1 according to an exemplary embodiment of the inventive concept. FIG. 3 is a diagram illustrating a detailed structure of the flash memory 100 of FIGS. 1 and 2 according to an exemplary embodiment of the inventive concept.

Referring to FIGS. 2 and 3, the flash memory 100 may include a memory cell array 110, a row selector circuit (X-SEL) 120, a page buffer circuit 130, a column selector circuit (Y-SEL) 140, a control logic circuit 150, and a voltage generator 160. The voltage generator 160 may include a variable read voltage generator 170. A flash memory controller 200 may include an error correction circuit (ECC) 230, a main controller 240, and a system bus 250.

As illustrated in FIG. 3, the memory cell array 110 may include a plurality of cell strings (or NAND strings) 111 connected respectively to bit lines BL0~BLm−1. The cell string 111 of each column may include at least one string selection transistor SST and at least one ground selection transistor GST. A plurality of memory cells (or memory cell transistors) MC0~MCn−1 may be connected in series between the selection transistors SST and GST. Each of the memory cells MC0~MCn−1 may include a multi-level cell (MLC) that stores multi-bit data per cell. The strings 111 may be electrically connected to the corresponding bit lines BL0~BLm−1, respectively.

FIG. 3 illustrates an exemplary case where the flash memory 100 is a NAND flash memory. However, the flash memory 100 of the inventive concept is not limited to a NAND flash memory. For example, the memory cell array 110 may be configured to include a NOR flash memory, a hybrid flash memory with a hybrid of at least two types of memory cells, or a One-NAND flash memory with a controller embedded in a memory chip. The operation characteristics of the flash memory 100 according to the inventive concept may be applicable not only to a flash memory with a charge storage layer including a conductive floating gate, but also to a charge trap flash (CTF) memory with a charge storage layer including a dielectric layer.

The control logic circuit 150 of FIG. 2 may control an overall operation related to a program/erase/read operation. According to operation modes, the voltage generator 160 may generate word line voltages (e.g., a program voltage Vpgm, a read voltage Vread, and a pass voltage Vpass) to be supplied to the respective word lines, and a voltage to be supplied to a bulk (e.g., a well region) including memory cells. The voltage generating operation of the voltage generator 160 may be performed under the control of the control logic circuit 150. The voltage generator 160 may include the variable read voltage generator 170 to generate a plurality of variable read voltages for reading a plurality of soft decision data.

In response to the control of the control logic circuit 150, the row selector circuit 120 may select one of the memory blocks (or sectors) of the memory cell array 110 and may select one of the word lines of the selected memory block. In response to the control of the control logic circuit 150, the row selector circuit 120 may provide the word line voltages, generated by the voltage generator 160, respectively to the selected word line and the unselected word lines.

The page buffer circuit 130 may be controlled by the control logic circuit 150 to operate as a sense amplifier or a write driver according to an operation mode. For example, in a verify/normal read operation, the page buffer circuit 130 operates as a sense amplifier for reading data from the memory cell array 110. In a normal read operation, the column selector circuit 140 outputs data, read from the page buffer circuit 130, to an external device (e.g., the memory controller 200 or a host) in response to column address information Y-addr. In a verify read operation, the read data may be provided to a pass/fail verification circuit (not illustrated) in the flash memory 100 to determine the program pass/fail of the memory cells.

In a program operation, the page buffer circuit 130 operates as a write driver that drives the bit lines according to the data to be stored in the memory cell array 110. In a program operation, the page buffer circuit 130 receives data, which is to be written in the memory cell array 110, from a buffer (not illustrated) and drives the bit lines according to the received data. To this end, the page buffer circuit 130 may include a plurality of page buffers PB corresponding respectively to columns (or bit lines) or column pairs (or bit line pairs). Each of the page buffers PB may include a plurality of latches. The latches may perform an operation of latching a plurality of soft decision data and hard decision data sensed from the page buffer PB, and an operation of generating reliability data from the sensed soft decision data. As will be described below in detail, the reliability data may be generated through a toggling operation of the latches of each page buffer in a read operation.

Figure 4:
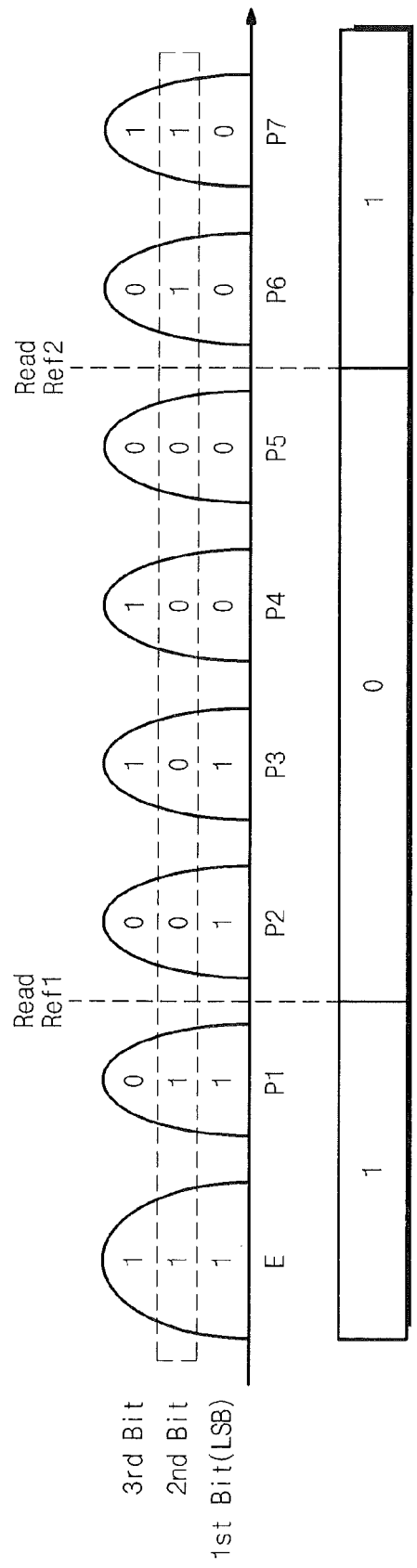
FIGS. 4 and 5 are diagrams illustrating an example of the threshold voltage distribution that may be formed in each cell of a 3-bit flash memory through a program operation.
Figure 5:
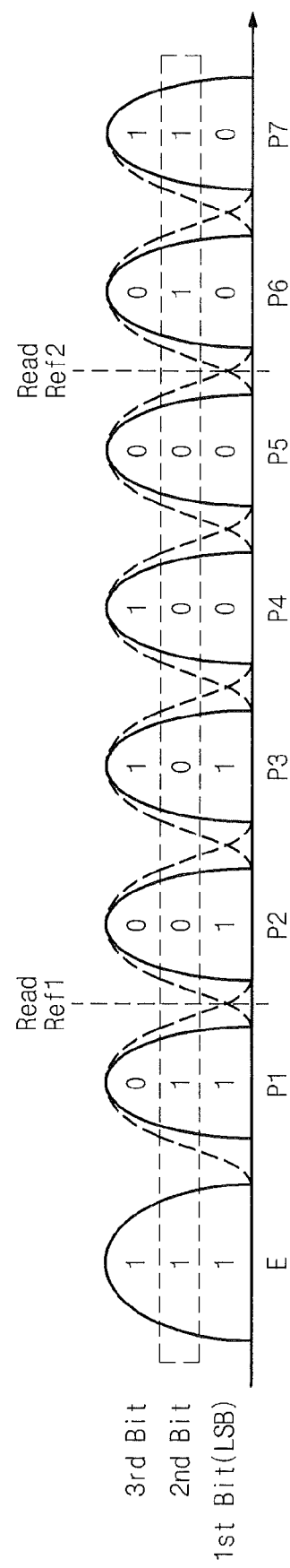

FIGS. 4 and 5 are diagrams illustrating an example of the threshold voltage distribution that may be formed in each cell of a 3-bit flash memory through a program operation. Referring to FIG. 4, the threshold voltage of a memory cell programmed with 3-bit data may correspond to one of 8-level data states E and P1~P7. Each of the data states may form a predetermined threshold voltage window. Each memory cell may store k-bit (e.g., 3-bit) data, and the respective bits may be programmed independently through a multi-stage program operation. For example, in the case of a 3-bit MLC, the first bit (i.e., the least significant bit (LSB)) among the three bits may be programmed first. Thereafter, the second bit and the third bit may be programmed sequentially.

The ideal data state of the programmed MLC must maintain a predetermined voltage interval with respect to an adjacent data state in order to secure a sufficient read margin. However, in a practical embodiment of the multi-bit flash memory, the threshold voltage distribution of each data state may change into an unideal form (See dotted-line sections) as illustrated in FIG. 5. This deformation may become more severe with an increase in the number of data bits stored in each memory cell. Also, the deformation may become more severe due to various factors such as charge loss, time lapse, temperature increase, coupling in the programming of an adjacent cell, reading of the adjacent cell, and cell defects. The read errors caused by the various factors may be corrected by the ECC 230. An accurate readout of the memory cell must precede for accurate data decision and error correction.

Two reference voltages Ref1 and Ref2 may be used to read out the second bit value among the 3-bit data programmed in the memory cell. For example, the second bit value may be read out as '1' or '0' according to the on/off state of the memory cell when the first reference voltage Ref1 and the second reference voltage Ref2 are applied thereto. The reference voltage Ref1 for the data readout may be determined by the ideal threshold voltage distribution illustrated in FIG. 4. Thus, relatively many errors may occur if the reference voltage Ref1 is used to read out the data state of the unideal threshold voltage distribution illustrated in FIG. 5. This may adversely affect data decision and error correction operations. Thus, in order to perform more accurate data decision and error correction, the inventive concept performs a plurality of read operations by using a plurality of variable read voltages in addition to the reference voltages. Also, a plurality of read data obtained from the read operations is provided to the ECC 230 to perform data decision and error correction.

Figure 6:
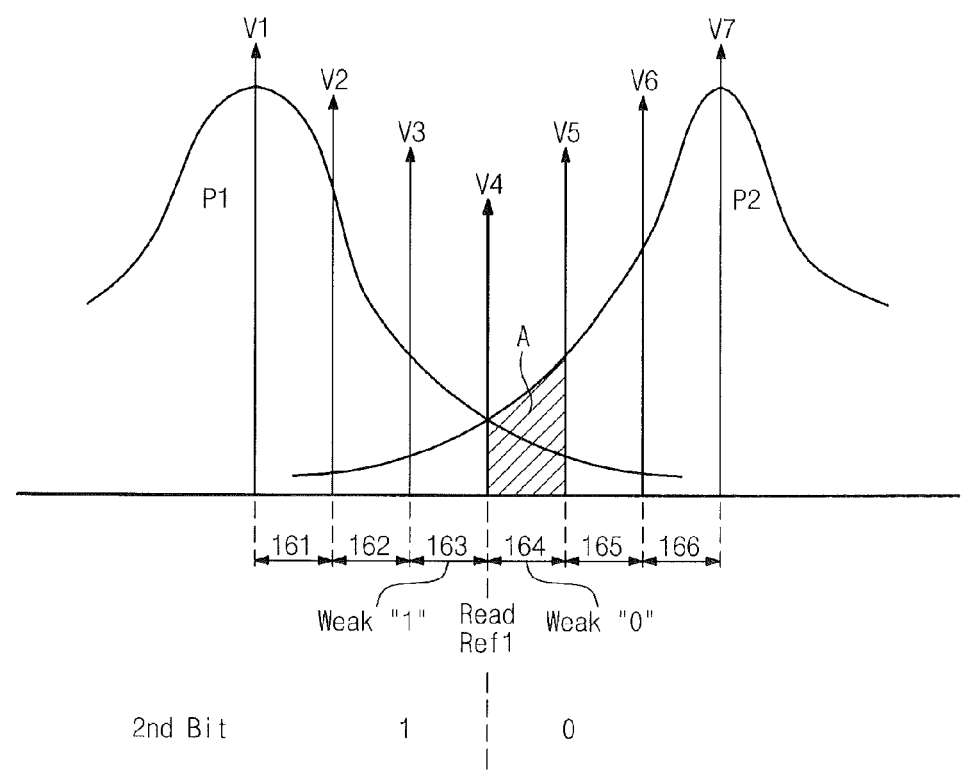
FIGS. 6 and 7 are diagrams illustrating a data read method for improvement of error correction efficiency according to an exemplary embodiment of the inventive concept.
Figure 7:
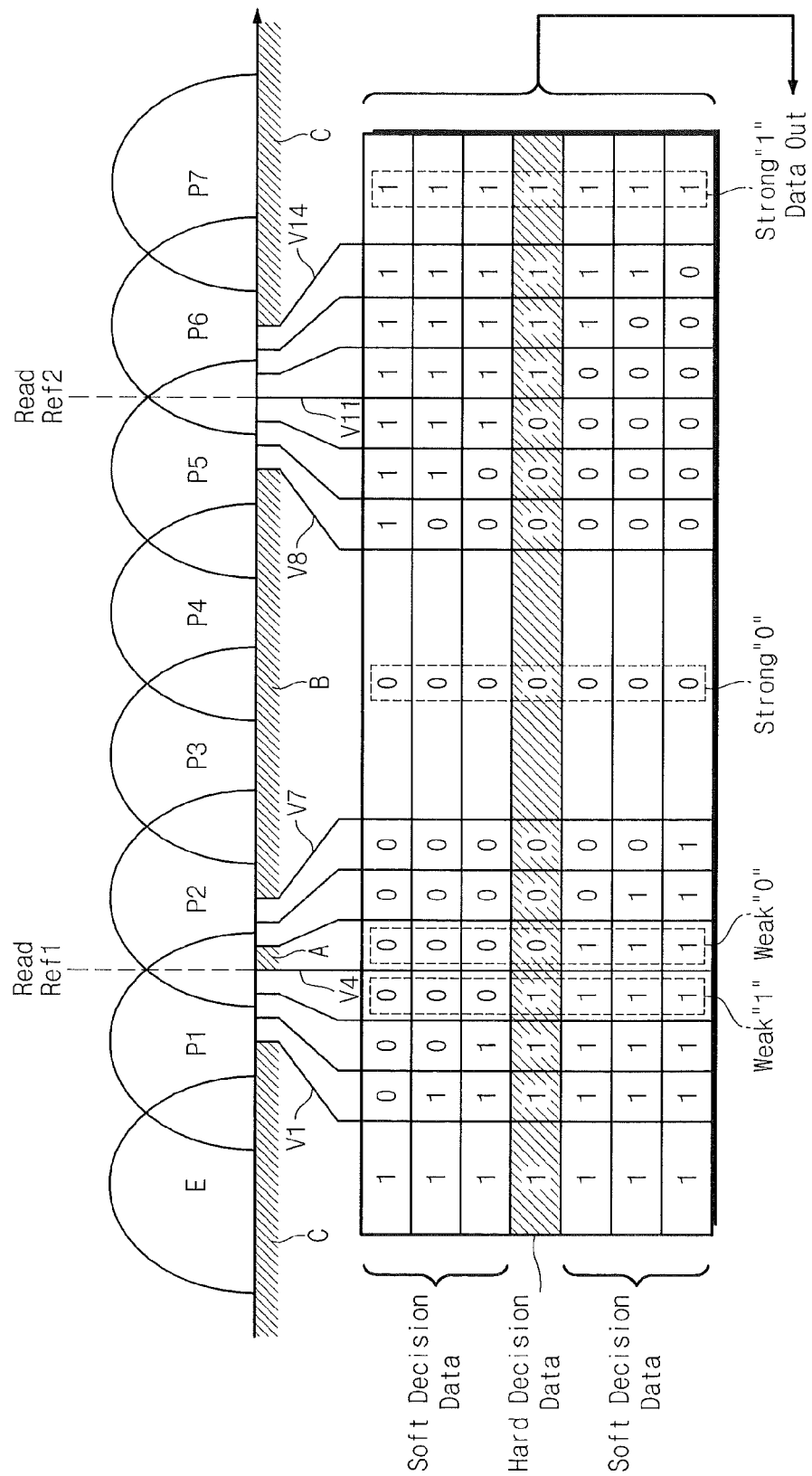

FIGS. 6 and 7 are diagrams illustrating a data read method for improvement of the error correction efficiency according to an exemplary embodiment of the inventive concept. The output read data pattern illustrated in FIG. 7 may be outputted from the flash memory 100 of FIGS. 2 and 3. Referring to FIGS. 6 and 7, in a read operation, a threshold voltage interval between the first reference voltage Ref1 and the second reference voltage Ref2 may be read out as data '0'. Also, a threshold voltage interval lower than the first reference voltage Ref1 and a threshold voltage interval higher than the second reference voltage Ref2 may be read out as data '1'. If adjacent threshold voltage distributions do not overlap each other like regions B and C, accurate data decision and error correction may be possible solely by the readout results based on the first and second reference voltages Ref1 and Ref2 (i.e., solely by hard decision data). In a hard decision operation, a memory cell with a threshold voltage distribution of the region B may be determined as a memory cell with a data state '0'.

However, if the adjacent threshold voltage distributions overlap each other, the accuracy of the read operation and error correction cannot be secured solely by the hard decision data. For example, the memory cell with a threshold voltage within a region A may be determined as a memory cell of the state P2 having a data state '0' in hard decision. However, the memory cell with a threshold voltage within the region A (a reference numeral 164 of FIG. 6) is highly probable to be a memory cell of the state P2 and is also highly probable to be a memory cell of the state P1. Thus, in this case, it must be considered whether the probability of the memory cell being a memory cell of the state P1 is higher than the probability of the memory cell being a memory cell of the state P2. For example, in terms of the probability of having a data state '0', the memory cell with a threshold voltage within the region A is the lowest among regions (164, 165 and 166 of FIG. 6) that are determined as a data state '0'. This case may be recognized as a weak '0' in a soft decision scheme. Meanwhile, the probability of a memory cell of the region B having a data state '1' reaches approximately 0. Therefore, in a soft decision operation, the memory cell of the region B may be recognized as a state of strong '0'. The probability of the memory cell having a data state '0' increases as the threshold voltage distribution approaches the region B in the interval (e.g., 164, 165 and 166 of FIG. 6) where the memory cell is recognized as data '0'.

In order to perform more accurate data decision and error correction, the inventive concept performs a plurality of read operations by using a plurality of variable read voltages in addition to the reference voltages. Also, for error correction, a plurality of read data obtained from the read operations is provided from the page buffer PB directly to the ECC 230 without passing through an additional circuit (e.g., an encoder).

FIGS. 6 and 7 illustrate examples of the read voltages V1~V7 and V8~V14 applied to read the second bit value among the 3-bit data programmed in the memory cell. The intervals 161~166 between read voltages V1~V7 and V8~V14 for a read operation may be configured to have the same size or different sizes. The number of read voltages V1~V7 and V8~V14 and the voltage difference between the read voltages V1~V7 and V8~V14 may vary according to various embodiments. Also, the voltage difference may have a fixed value or may vary according to user's selection or operation modes.

The read voltages V1~V7 and V8~V14 may be divided into reference voltages and variable read voltages. For example, two reference voltages Ref1 and Ref2 may be used to read the second bit value among the 3-bit data programmed in the memory cell. The first reference voltage Ref1 is denoted by V4 and the second reference voltage Ref2 is denoted by V11. The data read by applying the reference voltages Ref1 and Ref2 are referred to as hard decision data. In the inventive concept, a plurality of variable read voltages may correspond to each of the reference voltages Ref1 and Ref2. Variable read voltages V1~V3 and V5~V7 may correspond to the first reference voltage Ref1, and variable read voltages V8~V10 and V12~V14 may correspond to the second reference voltage Ref2. The data read by a plurality of variable read voltages are referred to as soft decision data. In an exemplary embodiment, 6 soft decision data may be obtained additionally with respect to 1 hard decision data so that a total of 7-bit data may be outputted as read data. Herein, the number of soft decision data corresponding to 1 hard decision data may vary according to various embodiments. FIG. 7 illustrates an example of the pattern of 7-bit read data that are obtained according to an embodiment of the inventive concept.

The ECC 230 may determine data on the basis of the 7-bit read data pattern received from the flash memory 100, and may perform error correction on the basis of the determination results. The probability of being determined as '0' increases with an increase in the number of 0s among the 7-bit read data pattern received from the flash memory 100. Also, the probability of being determined as '1' increases with an increase in the number of is among the 7-bit read data pattern.

For example, if the 7-bit read data pattern is "0, 0, 0, 0, 1, 1, 1", the memory cell may be recognized as a memory cell included in the region A, which may mean a weak '0' in soft decision. If the 7-bit read data pattern is "0, 0, 0, 1, 1, 1, 1", the memory cell may mean a weak '1' in soft decision. If the 7-bit read data pattern is "0, 0, 0, 0, 0, 0, 0", the memory cell may be recognized as a memory cell included in the region B, which may mean a strong '0' in soft decision. If the 7-bit read data pattern is "1, 1, 1, 1, 1, 1, 1", the memory cell may be recognized as a memory cell included in the region C, which may mean a strong '1' in soft decision. According to this configuration, by analyzing the 7-bit read data in a read operation, it can be accurately known whether the threshold voltage distribution of the memory cell is present in a certain region (e.g., 161~166 of FIG. 6). Thus, more accurate error correction is possible.

Herein, each of the data constituting the 7-bit read data pattern may mean the data value that is sensed in the page buffer PB when each read voltage is applied thereto. This may mean that the page buffer PB generates additional information (e.g., a plurality of soft decision data) for error correction even when the flash memory 100 does not include an additional circuit such as an encoder.

Each of the read voltages V1~V7 and V8~V14 may be generated by the voltage generator 160 under the control of the control logic circuit 150 of FIG. 2. The voltage generator 160 may include a variable read voltage generator 170. The variable read voltage generator 170 may generate a plurality of variable read voltages V1~V3, V5~V7, V8~V10 and V12~V14 under the control of the control logic circuit 150. The level of each of the read voltages V1~V7 and V8~V14 may vary according to various embodiments.

The 7-bit read data pattern illustrated in FIG. 7 may be obtained through each of the page buffers PB under the control of the control logic circuit 150. Each of the page buffers PB may include a plurality of latches that latches sensed data. For example, if the page buffer PB includes 7 latches, the 7-bit read data may be latched through the 7 latches. For example, if the page buffer PB includes 2 latches, the first latch may perform a function of latching the 7-bit read data whenever it is sensed and the second latch may perform a function of backing up and outputting the data latched in the first latch while the page buffer PB is sensing data.

Meanwhile, a plurality of read operations in each page buffer PB using a plurality of read voltages V1~V7 and V8~V14 may be implemented in various ways. For example, it may be obtained by sequentially repeating a precharge operation and a sensing operation or by performing a plurality of sensing operations with respect to one precharge operation. A plurality of read operations in each page buffer PB or a sensing operation for a plurality of data bits may be implemented in various modes.

Figure 8:
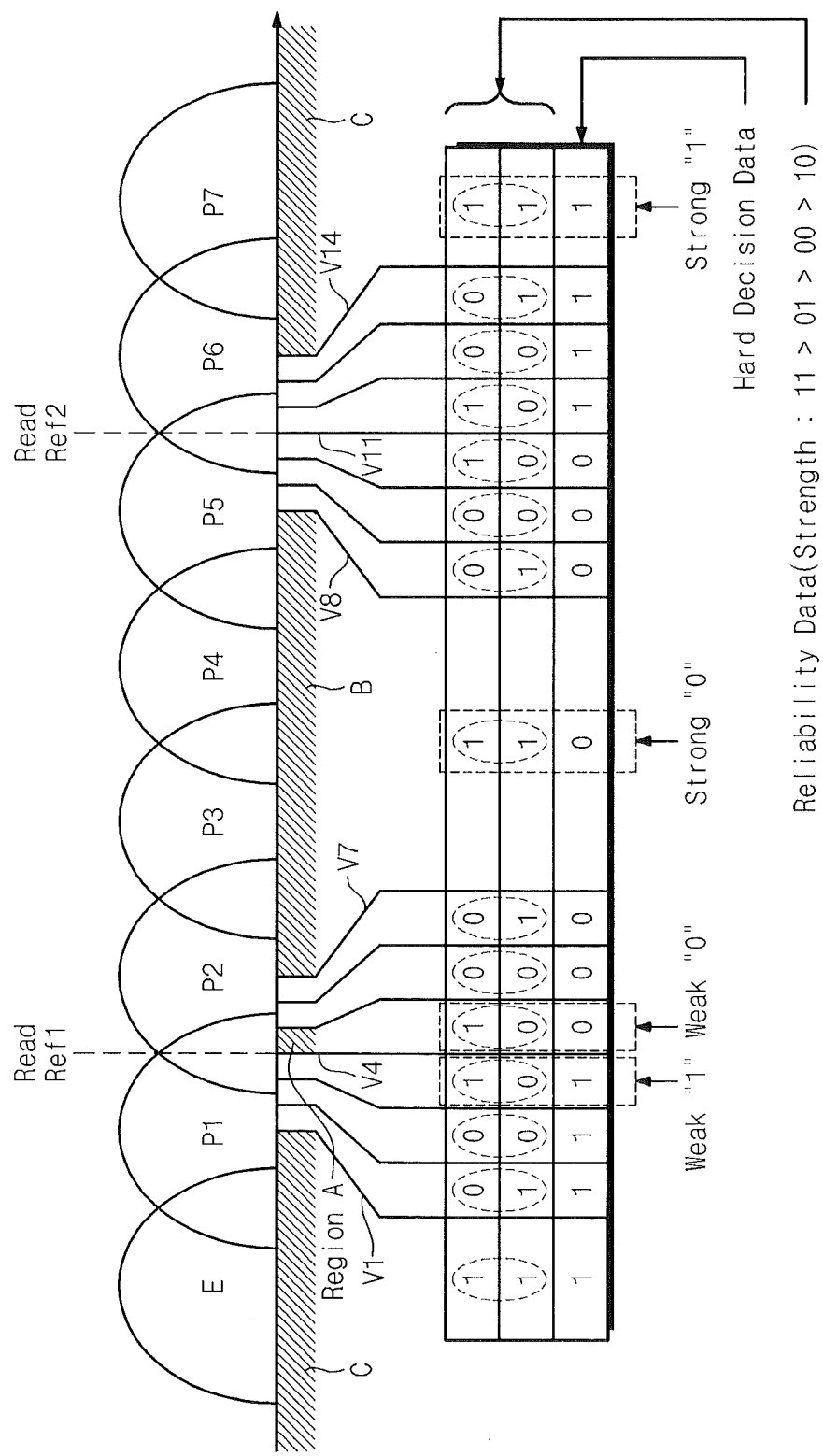
FIGS. 8 and 9 are diagrams illustrating a read method according to another exemplary embodiment of the inventive concept.
Figure 9:
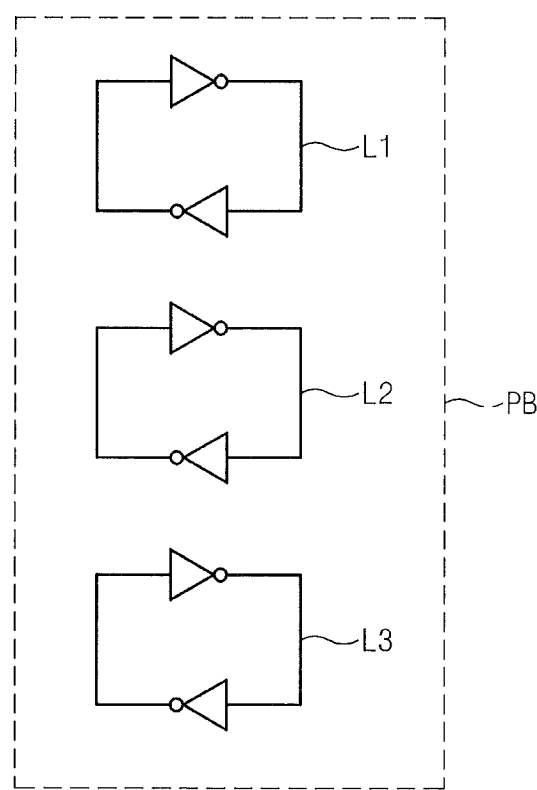

FIGS. 8 and 9 are diagrams illustrating a read method according to another exemplary embodiment of the inventive concept. FIG. 8 illustrates hard decision data outputted from the page buffer PB, and the corresponding reliability data. FIG. 9 illustrates a latch structure of the page buffer PB that generates the data pattern illustrated in FIG. 8. The output read data pattern illustrated in FIG. 8 may be outputted directly from the page buffer circuit 130 of FIGS. 2 and 3 without using an additional circuit such as an encoder. The structure of the page buffer PB illustrated in FIG. 9 is substantially identical to the structure of the page buffer PB of the page buffer circuit 130 illustrated in FIGS. 2 and 3.

In this embodiment, the form of a plurality of read voltages applied in a plurality of read operations may be configured in the same way as described with reference to FIGS. 6 and 7. Also, the form of the read data pattern sensed in the page buffer PB may be configured in the same way as described with reference to FIG. 7. However, according to another exemplary embodiment, the form of the data pattern outputted from the page buffer PB may be configured to have a 3-bit configuration unlike the illustration of FIG. 7. That is, seven read operations may be iteratively performed to output one read data pattern comprised of 3 bits. The form of data sensed in seven iterative read operations may be identical to that of FIG. 7, but the actually outputted data may have a predetermined data pattern as illustrated in FIG. 8. In the inventive concept, a plurality of data sensed in the page buffer PB may be directly outputted as reliability data, which may be used for the soft decision of the ECC 230, without passing through an additional circuit (e.g., an encoder). In an exemplary embodiment, the read data outputted through the page buffer PB may include 1-bit hard decision data and 2-bit reliability data. Herein, the bit number and configuration of the outputted read data and reliability data may vary according to various embodiments.

Referring to FIG. 9, each of the page buffers PB may include at least three latches to output 3-bit read data. FIG. 9 illustrates an exemplary case where the page buffer PB includes three latches L1~L3. One (e.g., L3) of the latches L1~L3 may be used to latch hard decision data. The other two latches (e.g., L1 and L2) may be used to generate 2-bit reliability data in response to the sensing result of the page buffer PB. In an exemplary embodiment, the reliability data may be generated by toggling the latches L1 and L2 to a value different from the latched value whenever the sensing result of the page buffer PB becomes '0'. Each of the latches L1~L3 may be initialized to a state '1'. A plurality of (e.g., seven) read operations may be performed using a plurality of (e.g., seven) different read voltages corresponding to the respective reference voltages, while the latches L1~L3 are initialized.

For example, the read result sensed from the memory cell with a threshold voltage distribution within the interval 161 of FIG. 6 has a pattern of "0, 1, 1, (1), 1, 1, 1". Herein, the data of (1) are hard decision data and may be latched by the latch L3. The hard decision data may be configured not to engage in the toggling of the latches L1 and L2. In this case, since the soft decision data include one 0, only the value latched in the latch L1 toggles from '1' to '0' and the latch L2 maintains a data state '1', that is, an initial value. Therefore, the output read data corresponding to the interval 161 of FIG. 6 may include reliability data '01' and hard decision data '1'. In a soft decision operation, from the hard decision data '1' and the reliability data '01' received from the flash memory 100, the ECC 230 may recognize that a threshold voltage distribution of the memory cell is included in the interval 161 of FIG. 6.

The read result sensed from the memory cell with a threshold voltage distribution within the interval 162 of FIG. 6 has a pattern of "0, 0, 1, (1), 1, 1, 1", In this case, the soft decision data include two 0s. If the soft decision data include one 0, the reliability data have a value '01'. Therefore, if the soft decision data include two 0s, the latch L2 toggles from '1' to '0' while the latch L1 maintains data '0', thus constructing reliability data '00'. In this case, the hard decision data have a value '1'.

The read result sensed from the memory cell with a threshold voltage distribution within the interval 163 of FIG. 6 has a pattern of "0, 0, 0, (1), 1, 1, 1". In this case, the soft decision data include three 0s. If the soft decision data include two 0s, the reliability data have a value '00'. Therefore, if the soft decision data include three 0s, the latch L1 toggles from '0' to '1' and the latch L2 maintains a state '0'. Therefore, the output read data read from the memory cell belonging to the interval 163 may include reliability data '10' and hard decision data '1', which may mean a weak '1' in soft decision.

The read result sensed from the memory cell with a threshold voltage distribution within the interval 164 of FIG. 6 has a pattern of "0, 0, 0, (0), 1, 1, 1". Herein, the data of (0) are hard decision data and may be latched by the latch L3. The hard decision data may be configured not to engage in the toggling of the latches L1 and L2. In this case, since the soft decision data include three 0s, the output read data read from the memory cell belonging to the interval 164 may include reliability data '10' and hard decision data '0', which may mean a weak '0' in soft decision.

The read result sensed from the memory cell with a threshold voltage distribution within the interval 165 of FIG. 6 has a pattern of "0, 0, 0, (0), 0, 1, 1". In this case, the soft decision data include four 0s. If the soft decision data include three 0s, the reliability data have a value '10'. Therefore, if the soft decision data include four 0s, the latch L1 with a value '1' toggles from '1' to '0' and the latch L2 maintains a state '0'. Therefore, the output read data read from the memory cell belonging to the interval 165 may include reliability data '00' and hard decision data '0'.

The read result sensed from the memory cell with a threshold voltage distribution within the interval 166 of FIG. 6 has a pattern of "0, 0, 0, (0), 0, 0, 1". In this case, the soft decision data include five 0s. If the soft decision data include four 0s, the reliability data have a value '00'. Therefore, if the soft decision data include five 0s, the latch L2 with a value '0' toggles from '0' to '1' and the latch L1 maintains a state '0'. Therefore, the output read data read from the memory cell belonging to the interval 166 may include reliability data '01' and hard decision data '0'.

If the read result sensed from the memory cell has a pattern of "0, 0, 0, (0), 0, 0, 0", the soft decision data include six 0s. If the soft decision data include five 0s, the reliability data have a value '01'. Therefore, if the soft decision data include six 0s, the latch L1 with a value '0' toggles from '0' to '1' and the latch L2 maintains a state '1'. Therefore, if a data pattern, all data of which have a value '0', is sensed, the output read data may include reliability data '11' and hard decision data '0'. This may mean a strong '0' in soft decision. Likewise, the read voltages V8~V14 may be applied to output the data values corresponding to the data sensed in the page buffer PB. As described above, the reliability data outputted from the page buffer PB may have a value of "01, 00, 10 and 11". The data reliability size may be 11>01>00>10.

The read method of the inventive concept described above may be controlled to be performed selectively with respect to the case where an erase/program cycle (#P/E cycle) (i.e., one of the indexes for determination of the lifetime of the flash memory 100) is more than a predetermined count, the case where more than a predetermined number of errors occur, or the case where an accurate read operation or an accurate error correction operation is required. The read method according to the inventive concept may also be applicable to various cases other than the above cases. Also, the read method of the inventive concept described above may be applicable not only to a read operation on the upper bits (e.g., one or more MSB bits) stored in multi-level cells, but also to a read operation on the lower bits (e.g., LSB bits).

Figure 10:
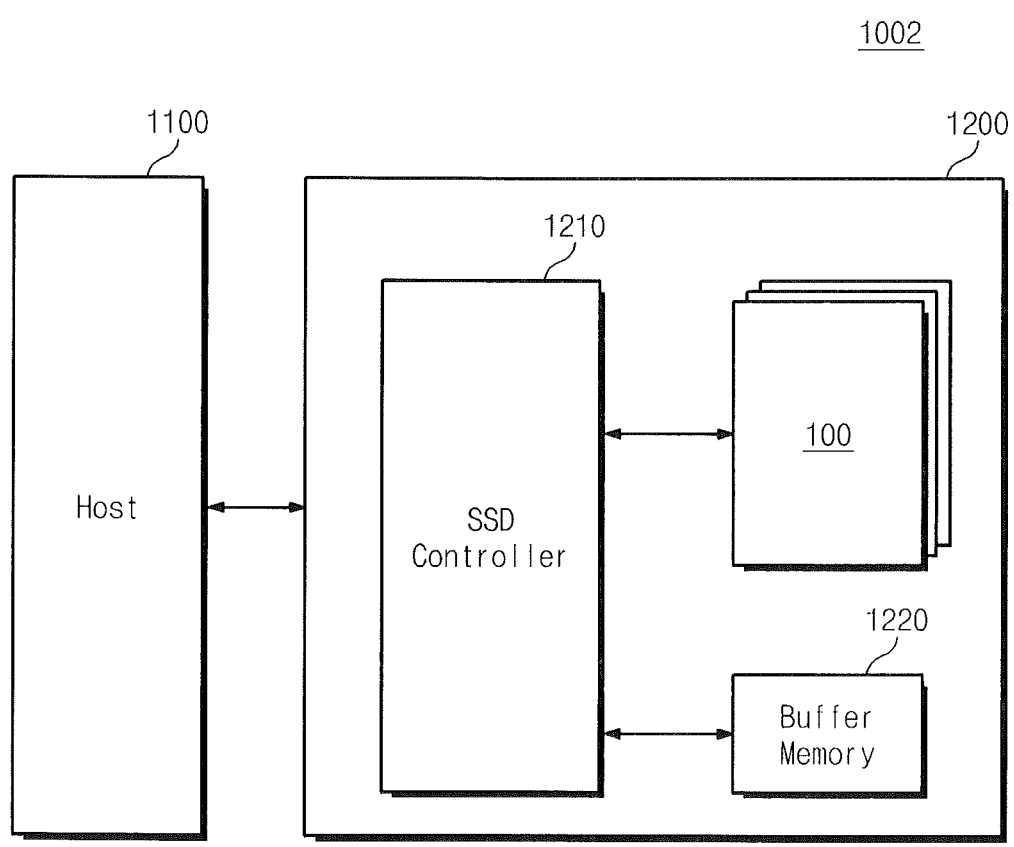
FIG. 10 is a diagram illustrating a structure of a solid state disk (SSD) system including a flash memory according to an exemplary embodiment of the inventive concept.

FIG. 10 is a diagram illustrating a structure of a solid state disk (SSD) system 1002 including a flash memory 100 according to an exemplary embodiment of the inventive concept. Referring to FIG. 10, the SSD system 1002 may include a host 1100 and an SSD 1200. The SSD 1200 may include an SSD controller 1210, a buffer memory 1220, and a flash memory 100. The SSD controller 1210 may provide a physical connection with the host 1100 and the SSD 1200. That is, the SSD controller 1210 may provide an interface with the SSD 1200 according to a bus format of the host 1100. The SSD controller 1210 may decode a command received from the host 1100. According to the decoding results, the SSD controller 1210 may access the flash memory 100. Examples of the bus format of the host 1100 may include Universal Serial Bus (USB); Small Computer System Interface (SCSI), PCI Express, ATA, Parallel ATA (PATA), Serial ATA (SATA), and Serial Attached SCSI (SAS).

The buffer memory 1220 may be configured using a synchronous DRAM (SRAM) in order to provide sufficient buffering in the SSD 1200. However, this is merely an example of the configuration of the buffer memory 1220. The configuration of the buffer memory 1220 is not limited to a specific embodiment but may vary according to various embodiments. The buffer memory 1220 may temporarily store write data received from the host 1100 or data read from the flash memory 100. At the read request of the host 1100, if data in the flash memory 100 is stored in the buffer memory 1220, the buffer memory 1220 may support a cache function of providing the stored data directly to the host 1100. Typically, the data transmission rate according to the bus format (e.g., SATA or SAS) of the host 1100 is much higher than the data transmission rate of a memory channel of the SSD 1200. If the interface rate of the host 1100 is much higher than that of the SSD 1200, a large-capacity buffer memory 1220 may be provided to minimize the performance degradation caused by the rate difference.

The flash memory 100 may be used as a main memory of the SSD 1200. To this end, the flash memory 100 may be configured using a NAND flash memory with a large storage capacity. However, the type of the flash memory 100 in the SSD 1200 is not limited to a NAND flash memory. For example, the flash memory 100 may also be configured using a NOR flash memory, a hybrid flash memory with a hybrid of at least two types of memory cells, or a One-NAND flash memory with a controller embedded in a memory chip. Also, a plurality of channels may be provided in the SSD 1200 and a plurality of flash memories 100 may be connected to the respective channels. Although a NAND flash memory has been exemplified as the main memory, other nonvolatile memories may be used as the main memory. For example, at least one of volatile memories (e.g., DRAMs and SRAMs) and nonvolatile memories (e.g., PRAMs, MRAMs, ReRAMs, and FRAMs) may be used as the main memory.

The flash memory 100 of FIG. 10 may be configured to have substantially the same configuration as the flash memory of FIGS. 2 and 3. The flash memory 100 may perform a plurality of read operations on a multi-level cell by applying a reference voltage and a plurality of variable read voltages that vary from the reference voltage. The read data obtained from the read operations may include hard decision data and a plurality of soft decision data. In providing the read data to the error correction circuit 230 to the ECC 230, the flash memory 100 of the inventive concept may provide the soft decision data without a change or may encode the soft decision data into a predetermined data format (i.e., reliability data) before providing it to the ECC 230. The reliability data and the soft decision data provided by the flash memory 100 may be generated by the page buffer of the flash memory 100 even without using an additional circuit such as an encoder.

Figure 11:
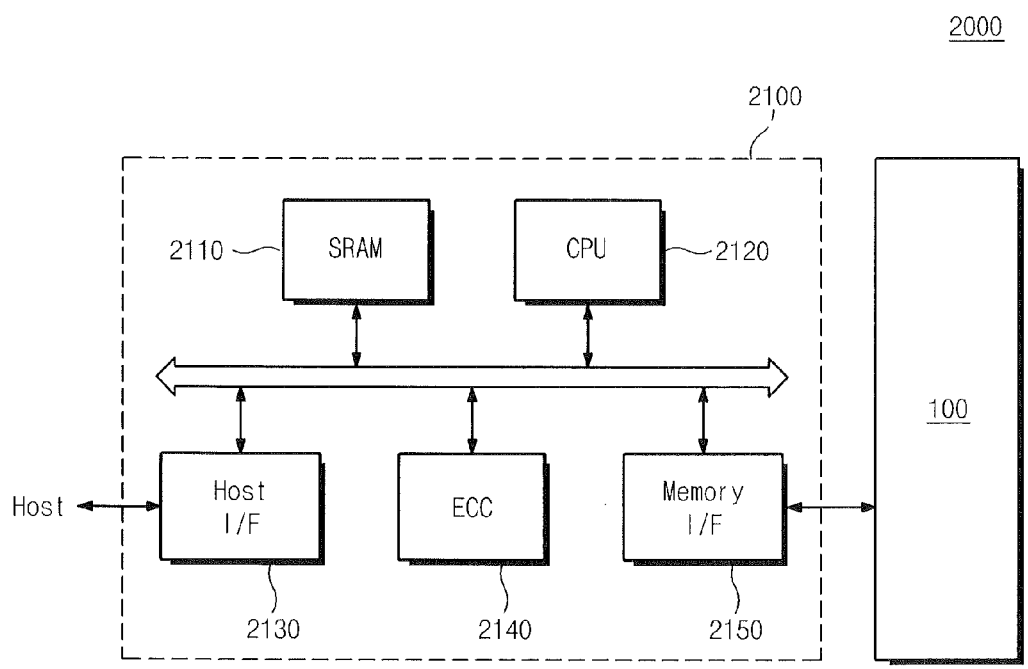
FIG. 11 is a diagram illustrating a structure of a memory system according to an exemplary embodiment of the inventive concept.

FIG. 11 is a diagram illustrating a structure of a memory system 2000 according to an exemplary embodiment of the inventive concept. Referring to FIG. 11, the memory system 2000 may include a flash memory 100 and a memory controller 2100. The flash memory 100 of FIG. 11 may be configured to have substantially the same configuration as the flash memory of FIGS. 2 and 3. Also, the flash memory 100 of FIG. 11 may perform a read operation as described above. The memory controller 2100 may be configured to control the flash memory 100. The memory controller 2100 may be configured to have the same configuration as the memory controller 200 of FIG. 2. Thus, an overlapping description of the same configuration will be omitted for conciseness.

A combination of the flash memory 100 and the memory controller 2100 may be provided as a memory card or a solid state disk (SSD). An SRAM 2110 may be used as a working memory of a central processing unit (CPU) 2120. A host interface (I/F) 2130 may have a data exchange protocol of a host connected to the memory system 2000. An error correction circuit (ECC) 2140 in the memory controller 2100 may be configured to have substantially the same configuration as the ECC 230 of FIG. 2. The ECC 2140 may detect/correct an error in read data by using a plurality of soft decision data or reliability data received from the flash memory 100. A memory interface (I/F) 2150 may interface with the flash memory 100. The CPU 2120 may perform an overall control operation for data exchange of the memory controller 2100. Although not illustrated in FIG. 11, the memory system 2000 may further include a read-only memory (ROM) that stores code data for interfacing with the host.

The flash memory 100 may be provided as a multi-chip package including a plurality of flash memory chips. The memory system 2000 of the inventive concept may be provided as a high-reliability storage medium with a low error probability. In particular, the flash memory of the inventive concept may be provided in a memory system such as a solid state disk (SSD) that is under active research. In this case, the memory controller 2100 may be configured to communication with an external device (e.g., the host) through one of various interface protocols such as USB, MMC, PCI-E, SAS, SATA, PATA, SCSI, ESDI, and IDE. Also, the memory controller 2100 may further include a configuration for performing a random operation.

Figure 12:
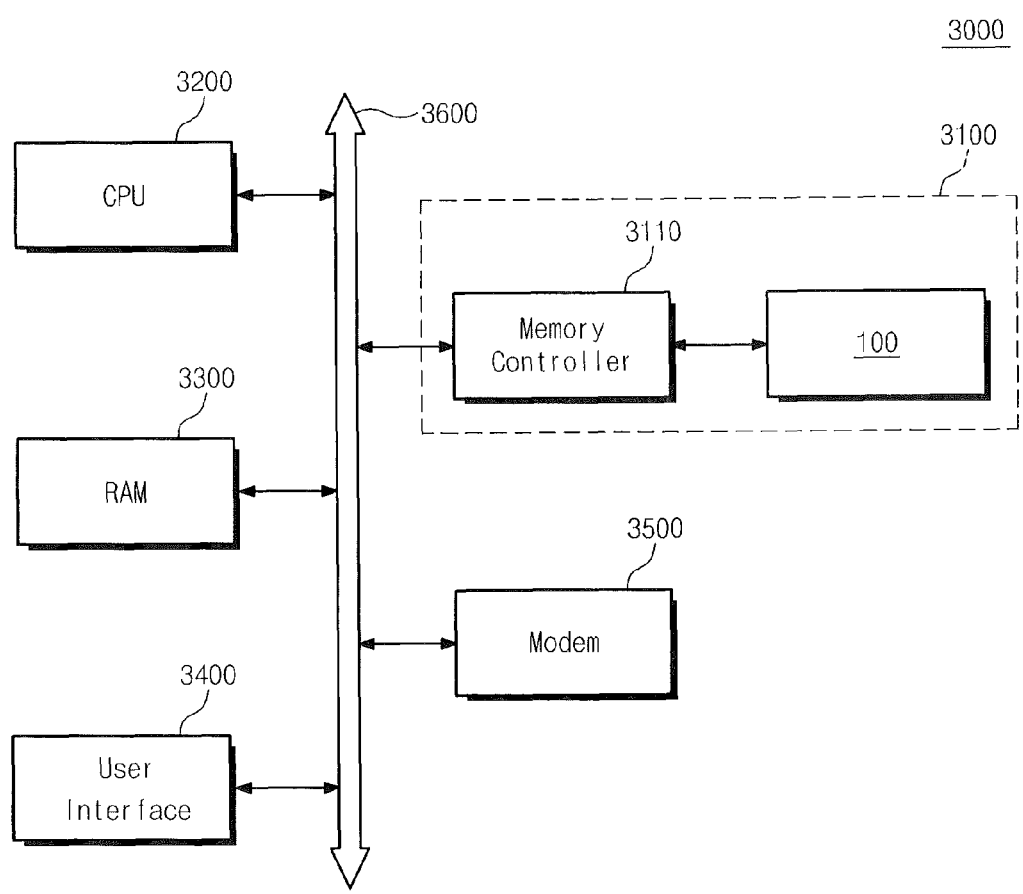
FIG. 12 is a diagram illustrating a structure of a computing system including a flash memory according to an exemplary embodiment of the inventive concept.

FIG. 12 is a diagram illustrating a structure of a computing system 3000 including a flash memory 100 according to an exemplary embodiment of the inventive concept. Referring to FIG. 12, the computing system 3000 may include a microprocessor (or CPU) 3200, a RAM 3300, a user interface 3400, a modem 3500 (e.g., a baseband chipset), and a memory system 3100 that are electrically connected to a system bus 3600. The memory system 3100 may include a memory controller 3110 and a flash memory 100. The memory controller 3110 may provide a physical connection with the CPU 3200 and the flash memory 100 through the system bus 3600. That is, the memory controller 3110 may provide an interface with the flash memory 100 according to a bus format of the CPU 3200. The flash memory 100 of FIG. 12 may be configured to have substantially the same configuration as the flash memory of FIGS. 2 and 3. Also, the flash memory 100 of FIG. 12 may perform a read operation as described above. Thus, an overlapping description of the same configuration will be omitted for conciseness.

If the computing system 3000 is a mobile device, a battery (not illustrated) may be further provided to supply an operation voltage of the computing system 3000. Although not illustrated in FIG. 12, the computing system 3000 may further include an application chipset, a camera image processor (CIS), and a mobile DRAM. For example, the memory system 3100 may constitute a solid state drive/disk (SSD) that uses a nonvolatile memory to store data. For example, the memory system 3100 of FIG. 12 may constitute the SSD 1200 of FIG. 10. In this case, the memory controller 3110 may operate as the SSD controller 1210.

The nonvolatile memory device and/or the memory controller according to the inventive concept may be mounted in various types of packages. Examples of the packages of the flash memory device and/or the memory controller according to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the inventive concept can generate additional information (e.g., soft decision data or data reliability information) for error correction by using a read operation of the page buffer even without using an additional circuit such as an encoder. Thus, the inventive concept can increase the error correction efficiency in a read operation of the flash memory without an increase in the chip size and can improve the reliability of multi-bit data read from the flash memory device.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A flash memory device comprising:
a memory cell array including a plurality of memory cells;
a control logic configured to control a read operation on the memory cells;
a page buffer circuit configured to sense hard decision data and a plurality of soft decision data from each of a plurality of selected memory cells in response to the control of the control logic and output the sensed hard decision data and the plurality of soft decision data as a read result; and
a voltage generator configured to generate a plurality of read voltages for reading the hard decision data and the plurality of soft decision data in response to the control of the control logic;
wherein the read result includes the hard decision data of 1 bit and the soft decision data of j bits where j is a positive integer.

2. The flash memory device of claim 1, wherein the voltage generator generates a reference voltage for reading the hard decision data and a plurality of variable read voltages for reading the soft decision data.

3. The flash memory device of claim 2, wherein each of the variable read voltages has a predetermined voltage difference from the reference voltage.

4. The flash memory device of claim 2, wherein the reference voltage and each of the variable read voltages have a variable voltage difference therebetween.

5. The flash memory device of claim 1, wherein the soft decision data included in the read result are outputted in the format sensed by the page buffer circuit, or are encoded and outputted as reliability data.

6. A flash memory device comprising:
a memory cell array including a plurality of memory cells;
a control logic configured to control a read operation on the memory cells;
a page buffer circuit configured to sense hard decision data and a plurality of soft decision data from each of a plurality of selected memory cells in response to the control of the control logic and output the sensed hard decision data and the plurality of soft decision data as a read result; and
a voltage generator configured to generate a plurality of read voltages for reading the hard decision data and the plurality of soft decision data in response to the control of the control logic;
wherein the soft decision data included in the read result are outputted in the format sensed by the page buffer circuit, or are encoded and outputted as reliability data; and
wherein the reliability data are encoded in the page buffer circuit.

7. A flash memory device comprising:
a memory cell array including a plurality of memory cells;
a control logic configured to control a read operation on the memory cells;
a page buffer circuit configured to sense hard decision data and a plurality of soft decision data from each of a plurality of selected memory cells in response to the control of the control logic and output the sensed hard decision data and the plurality of soft decision data as a read result; and
a voltage generator configured to generate a plurality of read voltages for reading the hard decision data and the plurality of soft decision data in response to the control of the control logic;
wherein the soft decision data included in the read result are outputted in the format sensed by the page buffer circuit, or are encoded and outputted as reliability data; and
wherein the read result includes the hard decision data of 1 bit and the reliability data of i bits where i is a positive integer smaller than j.

8. A flash memory device comprising:
a memory cell array including a plurality of memory cells;
a control logic configured to control a read operation on the memory cells;
a page buffer circuit configured to sense hard decision data and a plurality of soft decision data from each of a plurality of selected memory cells in response to the control of the control logic and output the sensed hard decision data and the plurality of soft decision data as a read result; and
a voltage generator configured to generate a plurality of read voltages for reading the hard decision data and the plurality of soft decision data in response to the control of the control logic;
wherein the soft decision data included in the read result are outputted in the format sensed by the page buffer circuit, or are encoded and outputted as reliability data; and
wherein the page buffer circuit includes a plurality of page buffers corresponding respectively to the selected memory cells, and each of the page buffers includes a plurality of first type latches configured to encode the reliability data by a latched value toggled in response to a value of the soft decision data and a second type latch configured to latch the hard decision data.

9. The flash memory device of claim 8, wherein the first type latches are sequentially enabled after being initialized to a predetermined value.

10. The flash memory device of claim 8, wherein the latched value of the first type latches is toggled whenever a predetermined soft decision data value is sensed from the corresponding memory cell.

11. A read method of a flash memory device, comprising:
generating a plurality of variable read voltages and a reference voltage for reading hard decision data from each of selected memory cells;
sensing the hard decision data and a plurality of soft decision data by applying the reference voltage and the variable read voltages to the selected memory cells; and
outputting the sensed hard decision data and soft decision data as a read result, wherein the soft decision data are outputted in the sensed format, or are encoded and outputted as reliability data;
wherein the reliability data are encoded in a page buffer circuit.

12. The read method of claim 11, further comprising performing data decision and error correction in response to the outputted read result, wherein the data decision includes a soft decision operation that is performed with reference to the reliability data or the soft decision data included in the read result.

13. A read method of a flash memory device, comprising:
generating a plurality of variable read voltages and a reference voltage for reading hard decision data from each of selected memory cells;
sensing the hard decision data and a plurality of soft decision data by applying the reference voltage and the variable read voltages to the selected memory cells; and
outputting the sensed hard decision data and soft decision data as a read result, wherein the soft decision data are outputted in the sensed format, or are encoded and outputted as reliability data;
wherein the read result includes the hard decision data of 1 bit and the soft decision data of j bits where j is a positive integer.

14. A read method of a flash memory device, comprising:
generating a plurality of variable read voltages and a reference voltage for reading hard decision data from each of selected memory cells;
sensing the hard decision data and a plurality of soft decision data by applying the reference voltage and the variable read voltages to the selected memory cells; and
outputting the sensed hard decision data and soft decision data as a read result, wherein the soft decision data are outputted in the sensed format, or are encoded and outputted as reliability data;
wherein the read result includes the hard decision data of 1 bit and the reliability data of i bits where i is a positive integer smaller than j.

15. A read method of a flash memory device, comprising:
generating a plurality of variable read voltages and a reference voltage for reading hard decision data from each of selected memory cells;
sensing the hard decision data and a plurality of soft decision data by applying the reference voltage and the variable read voltages to the selected memory cells; and
outputting the sensed hard decision data and soft decision data as a read result, wherein the soft decision data are outputted in the sensed format, or are encoded and outputted as reliability data;
wherein the reliability data are encoded by the toggled latched values of two or more latches of page buffers corresponding respectively to the selected memory cells, in response to the values of the soft decision data corresponding respectively to the selected memory cells.

16. The read method of claim 15, wherein the two or more latches are toggled whenever a predetermined soft decision data value is sensed from the corresponding memory cell.

* * * * *